United States Patent
Zhao et al.

(10) Patent No.: US 9,866,269 B1
(45) Date of Patent: Jan. 9, 2018

(54) METHOD OF AND CIRCUIT FOR PREDISTORTION FOR A POWER AMPLIFIER

(71) Applicant: Xilinx, Inc., San Jose, CA (US)

(72) Inventors: Hongzhi Zhao, Los Gatos, CA (US); Christopher H. Dick, San Jose, CA (US); Hemang M. Parekh, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/354,858

(22) Filed: Nov. 17, 2016

(51) Int. Cl.
  *H04B 1/62* (2006.01)
  *H04L 25/03* (2006.01)
(52) U.S. Cl.
  CPC ......... *H04B 1/62* (2013.01); *H04L 25/03847* (2013.01)
(58) Field of Classification Search
  CPC .................... H04B 1/62; H04L 25/03847
  See application file for complete search history.

(56) References Cited

U.S. PATENT DOCUMENTS

| | | | |
|---|---|---|---|
| 6,438,570 B1 | 8/2002 | Miller | |
| 6,584,481 B1 | 6/2003 | Miller | |
| 7,336,725 B2 * | 2/2008 | Cova | H03F 1/3258 375/296 |
| 8,737,523 B2 | 5/2014 | Barnes | |
| 9,172,409 B2 | 10/2015 | Copeland | |
| 2011/0204975 A1 * | 8/2011 | Miyashita | H03F 1/3247 330/149 |

* cited by examiner

*Primary Examiner* — Vineeta Panwalkar
(74) *Attorney, Agent, or Firm* — David O'Brien

(57) ABSTRACT

A digital predistortion (DPD) system includes an input configured to receive a DPD input signal. The DPD system includes a first predistortion circuit configured to provide a first signal path coupled to the input to generate a first predistortion signal. The first predistortion circuit includes a first infinite impulse response (IIR) filter. A second predistortion circuit is configured to provide a second signal path coupled to the input in parallel with the first signal path to generate a second predistortion signal. The second predistortion circuit includes a second IIR filter. A combiner circuit is configured to combine the first predistortion signal and the second predistortion signal to generate a DPD output signal.

20 Claims, 17 Drawing Sheets

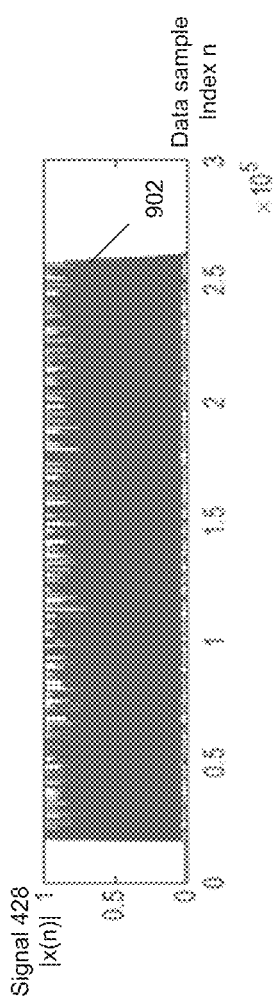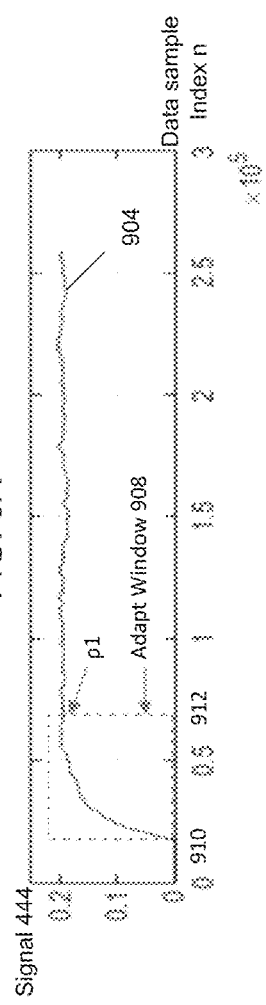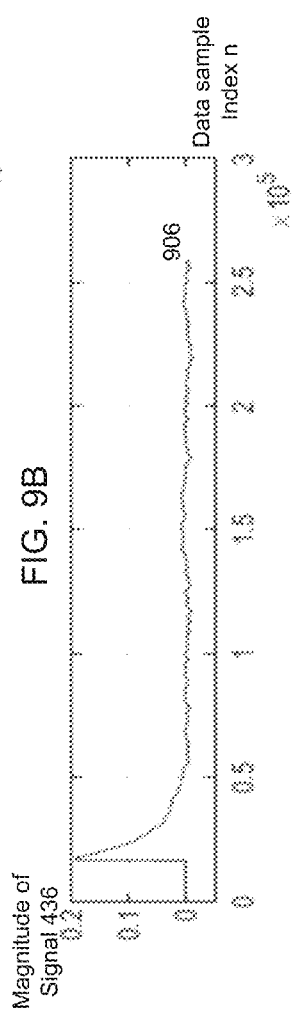
FIG. 9A
FIG. 9B
FIG. 9C

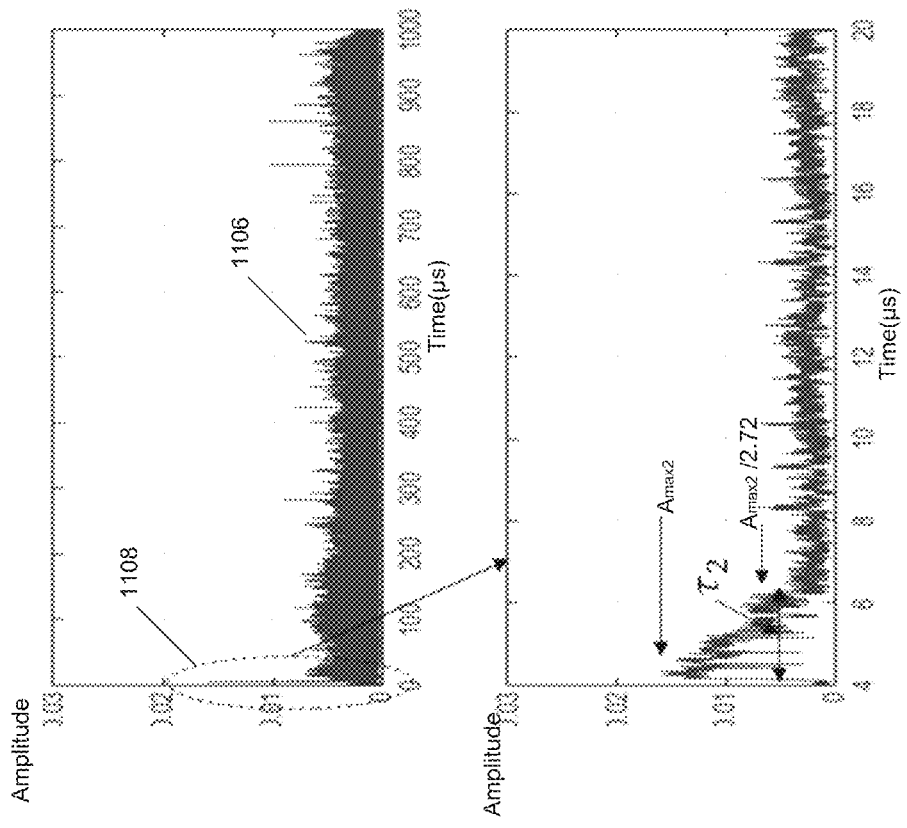

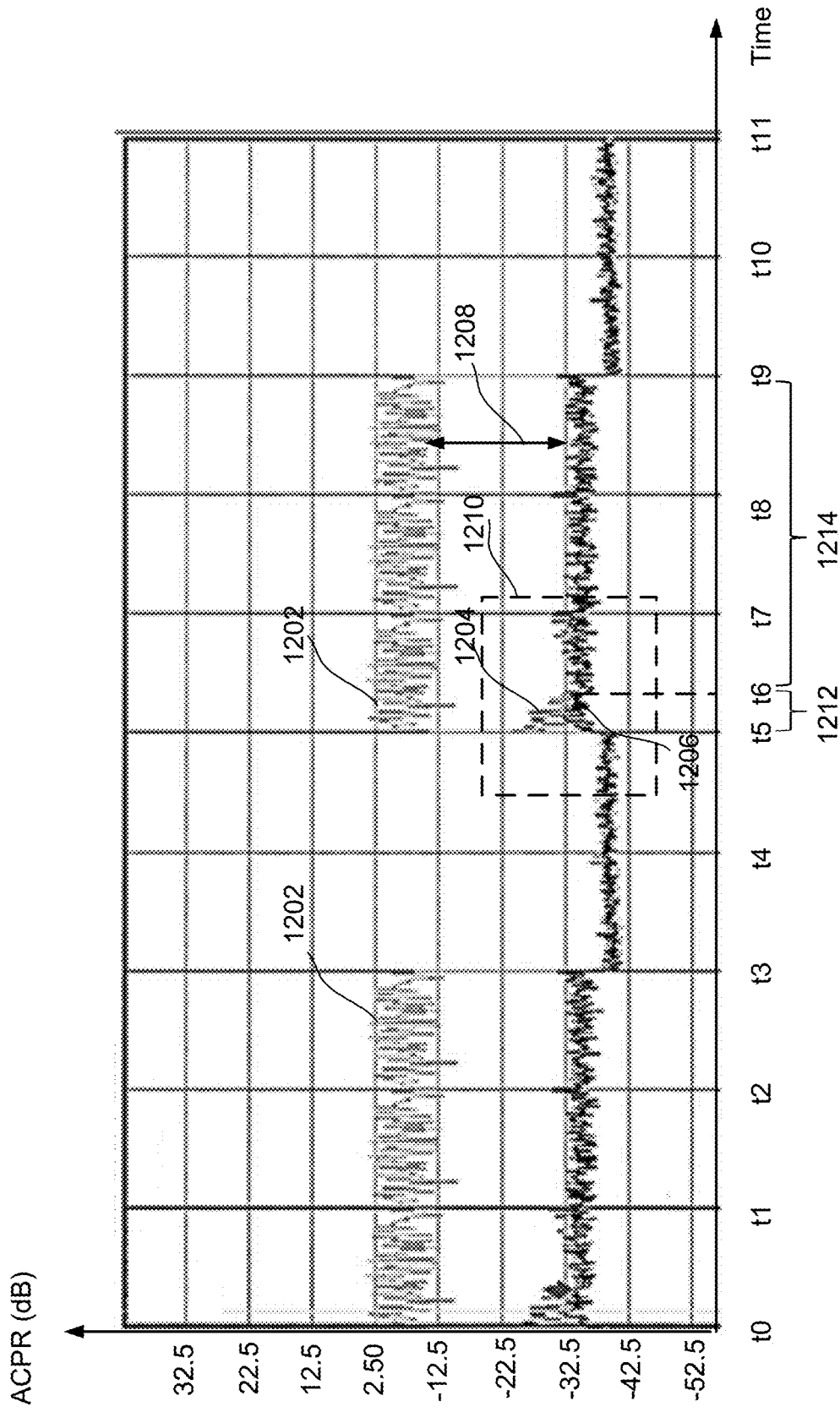

US 9,866,269 B1

METHOD OF AND CIRCUIT FOR PREDISTORTION FOR A POWER AMPLIFIER

TECHNICAL FIELD

Examples of the present disclosure generally relate to integrated circuits ("ICs") and, in particular, to an embodiment related to performing digital predistortion for power amplifiers.

BACKGROUND

Integrated circuits may be used for transmitting data in communication systems. One of the essential components of the communication system is a power amplifier. The nonlinearity of the power amplifiers creates spectral growth (broadening) beyond the signal bandwidth of a particular channel, which interferes with adjacent channels. It also causes distortions within the signal bandwidth of the particular channel, which decreases the bit error rate (BER) performance. While digital predistortion (DPD) techniques may be used to linearize a nonlinear power amplifier, it is challenging to meet the increasing performance requirements imposed by new applications in wireless communication.

Accordingly, an improved DPD system is desirable.

SUMMARY

In some embodiments in accordance with the present disclosure, a digital predistortion (DPD) system includes an input configured to receive a DPD input signal. The DPD system includes a first predistortion circuit configured to provide a first signal path coupled to the input to generate a first predistortion signal. The first predistortion circuit includes a first infinite impulse response (IIR) filter. The DPD system further includes a second predistortion circuit configured to provide a second signal path coupled to the input in parallel with the first signal path to generate a second predistortion signal. The second predistortion circuit includes a second IIR filter. The DPD system further includes a combiner circuit configured to combine the first predistortion signal and the second predistortion signal to generate a DPD output signal.

In some embodiments, the DPD output signal of the DPD system is coupled to an input of a power amplifier to generate an amplified output signal. The DPD output signal is configured to compensate for memory effects of the power amplifier.

In some embodiments, the power amplifier includes a gallium nitride (GaN) transistor.

In some embodiments, the first IIR filter is configured to compensate for a first memory effect of the GaN transistor.

In some embodiments, a first coefficient of the first IIR filter is determined based on a first memory effect time constant associated with the first memory effect.

In some embodiments, the second IIR filter is configured to compensate for a second memory effect of the GaN transistor. The second memory effect is different from the first memory effect.

In some embodiments, each of the first and second memory effects is selected from the group consisting of a gate lag effect, a drain lag effect, and a thermal effect of the GaN transistor.

In some embodiments, the first IIR filter and the second IIR filter are of different orders.

In some embodiments, the DPD system includes a third predistortion circuit configured to provide a third signal path coupled to the input in parallel with the first and second signal paths to generate a third predistortion signal. The third predistortion circuit does not include an IIR filter. The combiner circuit is configured to combine the first, second, and third predistortion signals to generate the DPD output signal.

In some embodiments, the third predistortion circuit is configured to perform a memory polynomial based predistortion operation on the DPD input signal to generate the third predistortion signal.

In some embodiments, a method includes receiving a DPD input signal at an input of a digital predistortion (DPD) system; providing, by a first predistortion circuit of the DPD system, a first signal path coupled to the input to generate a first predistortion signal, wherein the first predistortion circuit includes a first infinite impulse response (IIR) filter; providing, by a second predistortion circuit of the DPD system, a second signal path coupled to the input in parallel with the first signal path to generate a second predistortion signal, wherein the second predistortion circuit includes a second IIR filter; and combining the first predistortion signal and the second predistortion signal to generate a DPD output signal.

In some embodiments, the method includes amplifying, by a power amplifier, the DPD output signal to generate an amplified output signal. The DPD system is configured to compensate for memory effects of the power amplifier.

In some embodiments, the method includes compensating for a first memory effect of the GaN transistor using the first IIR filter.

In some embodiments, the method includes determining a first coefficient of the first IIR filter based on a first memory effect time constant associated with the first memory effect.

In some embodiments, the method includes compensating for a second memory effect of the GaN transistor using the second IIR filter. The second memory effect is different from the first memory effect.

In some embodiments, the method includes providing, by a third predistortion circuit of the DPD system, a third signal path coupled to the input in parallel with the first and second signal paths to generate a third predistortion signal, wherein the third predistortion circuit does not include an IIR filter; and combining the first, second, and third predistortion signals to generate the DPD output signal.

In some embodiments, the method includes performing, by the third predistortion circuit, a memory polynomial based predistortion operation on the DPD input signal to generate the third predistortion signal.

Other aspects and features will be evident from reading the following detailed description and accompanying drawings.

BRIEF DESCRIPTION OF THE DRAWINGS

FIGS. 9A, 9B, and 9C are diagrams of various signals of a DPD system according to some embodiments of the present disclosure.

FIGS. 11A, 11B, 11C, and 11D illustrate timing diagrams of various signals of a DPD system according to some embodiments of the present disclosure.

FIGS. 12A and 12B illustrate comparisons of adjacent channel power ratio (ACPR) time sweep performances of various embodiments according to the present disclosure.

DETAILED DESCRIPTION

Figure 1:
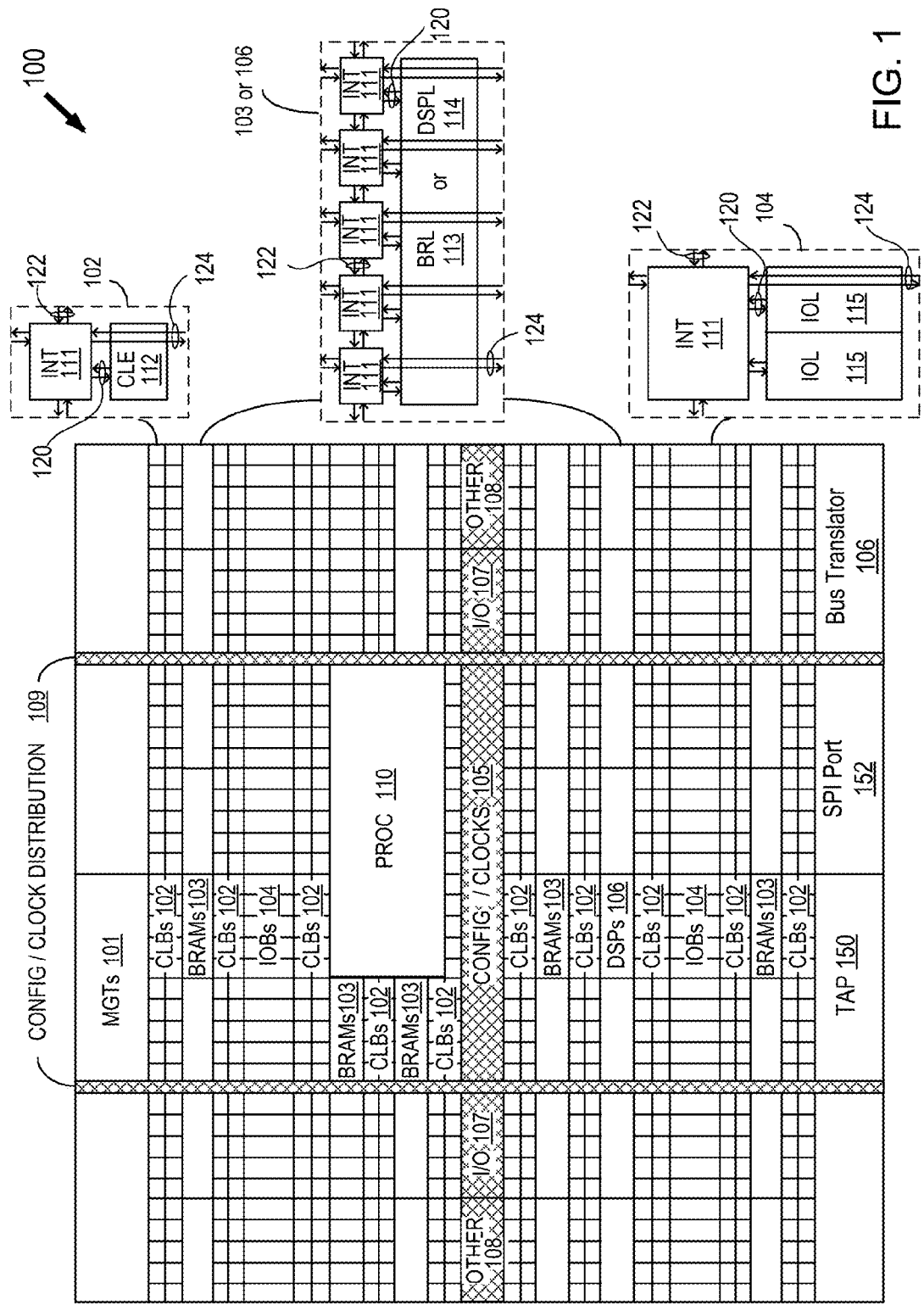
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. Power amplifiers are one of the essential components in communication systems and are inherently nonlinear. Nonlinearity in power amplifiers causes spectral growth beyond the signal bandwidth of a particular channel, which interferes with adjacent channels. It also causes distortions within the signal bandwidth, causing an increased bit error rate at a receiver. In various embodiments, DPD systems may be used to compensate for various distortions in power amplifiers, thereby reducing ACPR of the communication systems. It has been discovered that a DPD system may use infinite impulse response (IIR) filters to compensate for memory effects in power amplifiers including, for example, long term memory effects associated with deep electron trap effects in a gallium nitride (GaN) power amplifier.

With the above general understanding borne in mind, various embodiments for inductor structures are described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the DPD system to compensate for distortion in a power amplifier is not limited to the exemplary IC depicted in FIG. 1, and that IC having other configurations, or other types of IC, may also implement the DPD function.

Figure 2:
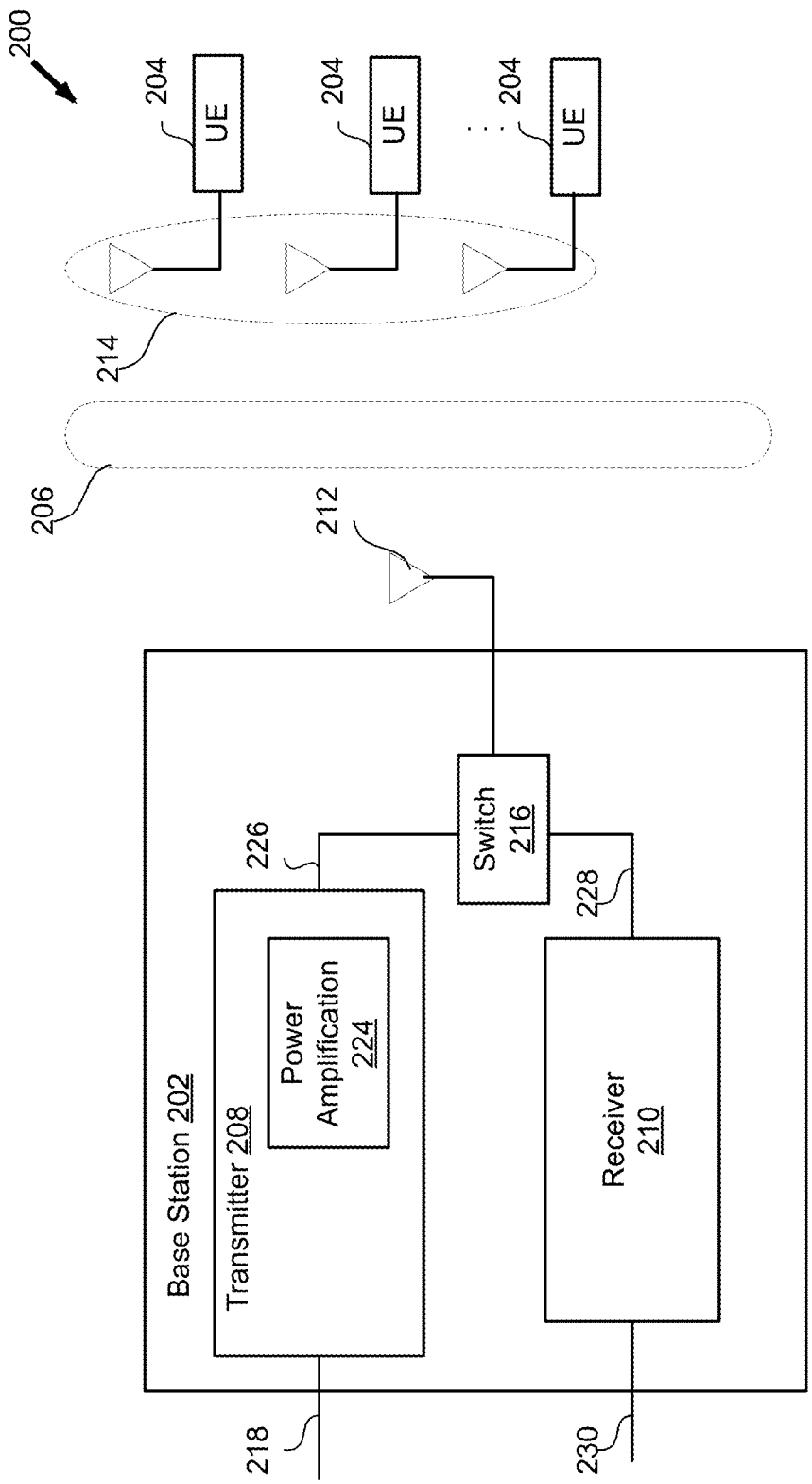
FIG. 2 is a block diagram illustrating a communication system according to some embodiments of the present disclosure.

FIG. 2 is a block diagram depicting an exemplary communication system 200 where a power amplification unit including a DPD system may be used. Communication system 200 includes a base station 202 and users 204 (also referred to as user devices or user equipment (UE) units). More than one user 204 may be coupled to base station 202 at a time. Users 204 may be coupled to base station 202 via over-the-air ("wireless") communication channel 206 using antennas 212 and 214.

In some embodiments, communication system 200 is for bidirectional communication, namely a downlink for sending information from base station 202 to users 204, and an uplink for sending information from users 204 to base station 202. Base station 202 may include a transmitter 208 configured to receive signal 218 for transmission. The transmitter 208 includes a power amplification unit 224, which may amplify the power of the signal to be transmitted and generates signal 226. Signal 226 is then sent to the antenna 212 for transmission. As such, power amplification unit 224 drives the antenna 212 for transmitting the signal 226 via wireless communication channel 206. Base station 202 may further include a receiver 210, which receives data 228 from antenna 212, performs an uplink process, and outputs data 230.

Communication system 200 may deploy various transmission schemes, for example, frequency division duplex (FDD) and time division duplex (TDD). In some embodiments where TDD (e.g., according to a TDD-Long-Term Evolution (LTE) standard) is deployed, the uplink is separated from downlink by the allocation of different time slots for uplink and downlink in the same frequency band. As illustrated in FIG. 2, in such embodiments, a duplexer (e.g., a switch) 216 may be used to switch between uplink and downlink according to the allocated time slots. Time slots allocated to downlink may be referred to as transmit time slots, and time slots allocated to uplink may be referred to as receive time slots.

Figure 3:
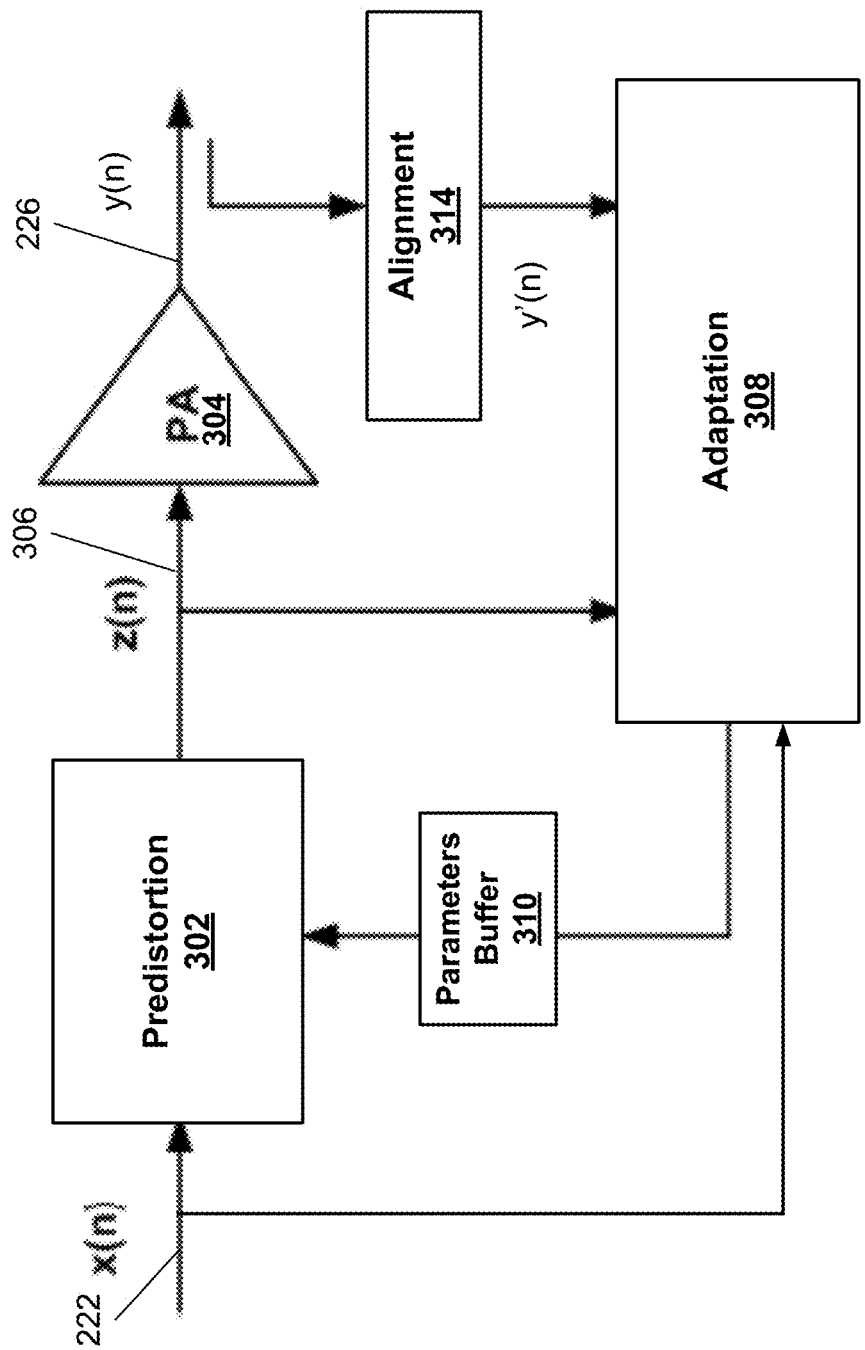
FIG. 3 is a block diagram illustrating a power amplification system according to some embodiments of the present disclosure.

Referring to FIG. 3, illustrated therein is an exemplary power amplification unit 224 including a DPD system 302 for reducing distortion at the output of a power amplifier 304. The DPD system 302 receives an input signal 222 (also denoted as x(n)) and generates a signal 306 (also denoted as z(n)). The output signal 306 is a modified version of the signal x(n), and is coupled to an input of power amplifier 304. The DPD system 302 modifies signal 222 to compensate for distortion in the power amplifier 304. The power amplifier 304 outputs a signal 226 (also denoted as y(n)).

In some embodiments, power amplification unit 224 includes an adaptation block 308 for adapting various parameters of the DPD system 302. In some examples, a predetermined number of samples of data from signal 306 provided to an input of the power amplifier 304 is captured (e.g., by using an output sampling coupler) and sent to adaptation block 308. In some examples, a predetermined number of samples of data from signal 226 provided at an output of the power amplifier 304 is captured (e.g., by using an output sampling coupler) and sent to adaptation block 308. In some examples, signal 226 may first be sent to an alignment block 314, which matches the amplitude, delay, and phase variations of y(n) to z(n), and generates an aligned power amplifier output y'(n). The aligned power amplifier output y'(n) is then sent to the adaptation block 308. In some examples, signal 222 may be sent to the adaptation block 308. The adaptation block 308 may determine parameters of DPD system 302 based on signals x(n), z(n) and/or y'(n). In some embodiments, those parameters may be stored in a parameter buffer 310, and then be provided to the DPD system 302. The parameters may be coefficients of various functions, for example, functions that modify the input signal x(n), such that the output z(n) of the DPD system 302 offsets the distortion of the power amplifier 304.

In various embodiments, the adaptation block 308 may use various numerical techniques for generating the parameters used in the DPD system 302. For example, discrete characterization events, where the coefficients are found that best match the power amplifier 304 during some period of L samples duration, where L is a positive integer, may be employed. For further example, least mean squares estimation over a fixed block of L samples may be used. However, any suitable method for generating parameters for a DPD system 302 may be used.

In some embodiments, the adaptation block 308 may use an embedded processor to provide adaptation functions, and generate the parameters for the DPD system 302, which may be provided to the parameter buffers 310 by a bus. The main working memory for the processor may include a dedicated embedded memory, and the data that is manipulated by the embedded processor may pass through the bus. The DPD system 302 may be implemented in configurable logic, such as configurable logic blocks of the circuit of FIG. 1. For example, the embedded memory may be implemented in the BRAMs of FIG. 1. The embedded processor may be the PROC 110 of FIG. 1. The adaptation may be implemented in software running on the embedded processor. In various embodiments, the embedded processor may be constructed from available hardware resources, or may be implemented as a hardware primitive. By way of example, the embedded processor may be a hardwired processor, or may be a processor implemented in configurable logic.

In some embodiments, the power amplification unit 224 may include a digital to analog converter (DAC) and an up converter coupled to the output of the DPD system 302 and the input of the power amplifier 304. In some examples, the DAC is coupled to receive the predistorted digital signal output of the DPD system 302 and provide an analog signal. An up converter may receive the analog signal from the DAC and convert it to an RF analog signal, which is then provided to the power amplifier 304. The power amplifier 304 may provide an amplified RF output signal.

In some embodiments, the power amplification unit 224 may include an output sampling coupler coupled an output of the power amplifier 304 to sample the analog RF output signal. An analog to digital converter (ADC) and a down converter may be used to convert the sampled RF output signal to a digital sampled signal, which is then provided to an input of the alignment block 314 or adaptation block 308.

In various embodiments, the DPD system 302 may be implemented based on power amplifier (PA) behavior models (also referred to as PA models) of the power amplifier 304. After determining the PA models which model the nonlinearity of the power amplifier 304, the inverse of such PA models may be applied to signal 222 by the DPD system 302 (e.g., before the signal 222 is converted from digital to analog using a digital-to-analog converter), thereby compensating for the nonlinearity of the power amplifier 304.

In some examples, the PA model is a memoryless PA model without any memory effect. Such memoryless model may include, for example, a polynomial model and Saleh's model. A DPD path implemented based on such a memoryless PA model may be referred to as a memoryless DPD path.

In some examples, the PA model is a memory PA model which considers memory effects of the power amplifier. Memory effects of the power amplifier may be classified as short term memory effects and long term memory effects according to time constants of the memory effects. In some embodiments, short term memory effects may have time constants of the order of carrier signal period (e.g., several times of the carrier signal period). In some examples, time constants of the short-term memory effects are of the order of nanoseconds. Long term memory effects may have a lower frequency (e.g., in a range between a few kilohertz (kHz) to megahertz (MHz)) and/or larger time constants than those of short term memory effects. In some examples, time constants of the long-term memory effects are of the order of microseconds, milliseconds, or greater.

In some examples, a PA model with short term memory effects may include, for example, memory polynomial model and Volterra model. A DPD path implemented based on such a PA model with short term memory effect may be referred to as a short term memory effect DPD path.

In some examples, a DPD path implemented based on such a PA model with long term memory effects may be referred to as a long term memory effect DPD path. Such a DPD path may include one or more IIR filters to compensate for the long term memory effects of the power amplifier.

In some embodiments, the power amplifier 304 is associated with one or more PA models including, for example, memoryless PA model, PA model with short term memory effects, PA model with long term memory effects, or a combination thereof. The DPD system 302 may include a plurality of parallel DPD paths, where the DPD paths correspond to the plurality of PA models respectively. In an example, DPD system 302 includes a plurality of parallel DPD paths including, for example, memeoryless DPD path, short term memory effect DPD path, and long term memory effect DPD path.

Figure 4A:
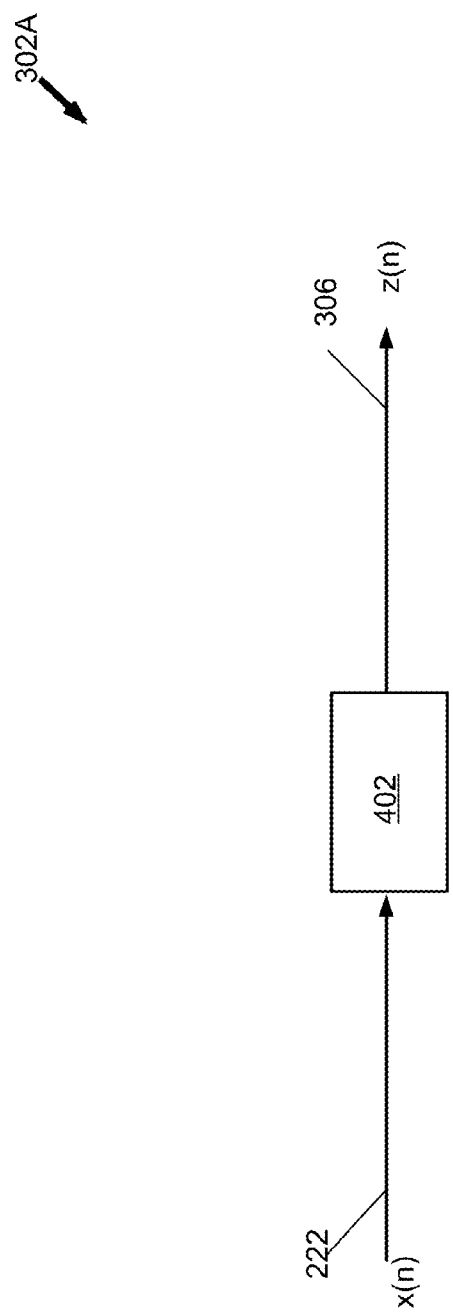
FIGS. 4A and 4B are block diagrams illustrating embodiments of a digital predistortion system and/or a portion thereof according to some embodiments of the present disclosure.
Figure 4B:
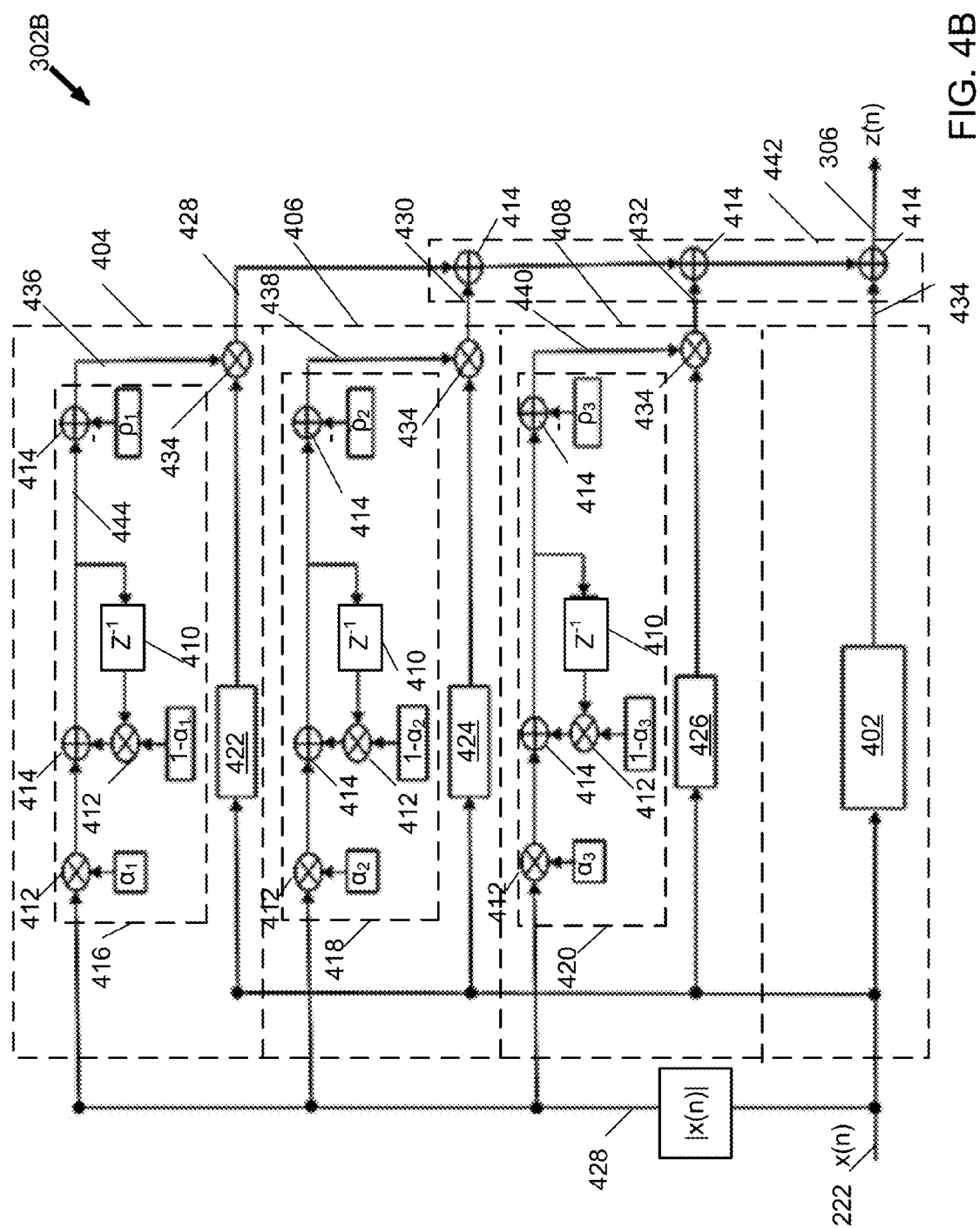

Referring to FIGS. 4A and 4B, DPD systems implemented based on various PA models are illustrated. Referring to FIG. 4A, the DPD system 302A illustrated therein is implemented based on a PA model with short term memory effects, and includes a short term memory effect DPD path 402. The short term memory effect DPD path 402 may be implemented based on a memory polynomial model to compensate for short term memory effects of the power amplifier 304. Such short term memory effects may be caused by reactive components of active devices and matching networks of the power amplifier 304. In some embodiments, the adaptation block 308 may adaptively configure the DPD path 402 (e.g., to model the short term memory effects of the power amplifier 304) via a plurality of parameters for the DPD path 402. For example, the parameters may include coefficients for a memory polynomial model used by the DPD path 402.

Referring to FIG. 4B, in some embodiments, a DPD system may be implemented to compensate for both short term memory effects and long term memory effects in the power amplifier 304. In the example of FIG. 4B, the DPD system 302B includes parallel DPD paths 402, 404, 406, and 408. DPD path 402 is substantially similar to the DPD path 402 of FIG. 4A, and may compensate for short term memory effects of the power amplifier 304. DPD path 402 may also be referred to as main DPD path 402. Each of DPD paths 404, 406, and 408 includes an IIR filter, and may be used to compensate for different long term memory effects of the power amplifier 304.

In some embodiments, DPD path 404 includes DPD path 422 coupled to an IIR filter 416. An input signal 222 (e.g., x(n)) of the DPD system 302B is sent to an input of DPD path 422, while signal 428 (e.g., |x(n)|, |x(n)|$^2$) generated based on signal 222 is sent to an input of IIR filter 416. The IIR filter 416 includes one or more delay units (taps) 410, a plurality of multipliers 412, and a plurality of adders 414. Parameters (coefficients) of the IIR filter 416, for example, parameters $\alpha_1$ and $\rho_1$, may be configured by the amplification system 224 (e.g., using the adaptation block 308) to compensate for long term memory effects of the power amplifier 304. An output 436 of the IIR filter 416 and an output of the DPD path 422 are sent to multiplier 434 to generate an output 428 of the DPD path 404.

In some embodiments, DPD path 406 includes DPD path 424 coupled to an IIR filter 418. Signal 222 is sent to an input of DPD path 424, while signal 428 having an absolute value of signal 222 is sent to an input of IIR filter 418. The IIR filter 418 includes one or more delay units (taps) 410, a plurality of multipliers 412, and a plurality of adders 414. Parameters (coefficients) of the IIR filter 418, for example, parameters $\alpha_2$ and $\rho_2$, may be configured by the amplification system 224 (e.g., using the adaptation block 308) to compensate for long term memory effects of the power amplifier 304. An output 438 of the IIR filter 418 and an output of the DPD path 424 are sent to multiplier 434 to generate an output 430 of the DPD path 406.

In some embodiments, DPD path 408 includes DPD path 426 coupled to an IIR filter 420. Signal 222 is sent to an input of DPD path 426, while signal 428 having an absolute value of signal 222 is sent to an input of IIR filter 420. The IIR filter 420 includes one or more delay units (taps) 410, a plurality of multipliers 412, and a plurality of adders 414. Parameters (coefficients) of the IIR filter 420, for example, parameters $\alpha_3$ and $\rho_3$, may be configured by the amplification system 224 (e.g., using the adaptation block 308) to compensate for long term memory effects of the power amplifier 304. An output 440 of the IIR filter 420 and an output of the DPD path 426 are sent to multiplier 434 to generate an output 432 of the DPD path 408.

In some embodiments, outputs 428, 430, 432, and 434 of the parallel DPD paths 404, 406, 408, and 402 are combined using a combiner 442 including one or more adders 414 to generate a signal 306 provided at an output of the DPD system 302b.

In some embodiments, the IIR filters 416, 418, and 420 have long impulse responses, and therefore may be configured to model various long term memory effects of the power amplifier 304 to compensate for those long term memory effects. Those long term memory effects may be attributed to the power amplifier's active device's dynamic thermal effects and/or the active device's charge carrier traps. In some embodiments, the adaptation block 308 may adaptively configure the IIR filters 416, 418, and 420 to model the long term memory effects of the power amplifier 304 via long term memory effects parameters (e.g., parameters $\alpha_1$, $\rho_1$, $\alpha_2$, $\rho_2$, $\alpha_3$, $\rho_3$) defining the IIR filters 416, 418, and 420. The adaptation block 308 may determine the parameters for the IIR filters 416, 418, and 420 using various algorithms, such as least mean square or recursive least squares algorithms. It is noted that while first order IIR filters are illustrated in FIG. 4B, they are exemplary only and not intended to be limiting beyond what is specifically recited in the claims that follow. It will be understood by those skilled in the art that IIR filters of any order may be used.

In some embodiments, the adaptation block 308 updates the long term memory effects parameters of the IIR filters 416, 418, and 420 at adaptation rates determined based on the stability of the IIR filters 416, 418, and 420. The IIR filters 416, 418, and 420 may include feedback and/or feedforward paths, and become unstable at high adaptation rates. As such, the IIR filters 416, 418, and 420 may have adaptation rates lower than threshold adaptation rates at which those IIR filters 416, 418, and 420 are stable. In some embodiments, the IIR filters 416, 418, and 420 have different adaptation rates. In some embodiments, the adaptation rates of the IIR filters 416, 418, and 420 are lower than an adaptation rate for other components (e.g., DPD paths 402, 422, 424, 426) of the DPD system 302B.

In some embodiments where the power amplifier 304 does not include long term memory effects, the adaptation block 308 may configure the long term memory effects parameters such that the IIR filters 416, 418, and 420 are deactivated, or in other words operate in a pass-through mode of operation.

Referring to FIGS. 4B, 5, 6, 7, and 8, in some embodiments, the DPD system 302B may be configured to compensate for long term memory effects of a gallium nitride (GaN) power amplifier, which includes a gallium nitride high electron mobility transistor (GaN-HEMT). A GaN-HEMT may show long term memory effects due to its deep electron trap effects, where the density of its traps may change versus the output power of the GaN power amplifier. In some embodiments, a communication system using a GaN power amplifier is an LTE-TDD system. In such a communication system, the GaN power amplifier may be turned on during downlink time slots, and be turned off during uplink time slots. After the GaN power amplifier is turned on during downlink time slots, the deep electron traps may experience slow charging and discharging processes. As such, a nonlinear behavior model of the GaN power amplifier changes slowly during this turning-on time period (transient period), even when the power amplifier output power is constant. Therefore, a digital predistortion model based on a memoryless PA model and/or a PA model with short term memory effects alone may not be sufficient to compensate for the nonlinearity in a GaN power amplifier.

In some embodiments, IIR filters of DPD system 302B of FIG. 4B may be used to model the non-linear gain changes of the GaN power amplifier over the power amplifier output power. The long term memory effects of the GaN power amplifier may include, for example, a gate lag effect, a drain lag effect, and a thermal effect. A GaN power amplifier may have a plurality of long term memory effects (e.g., a gate lag effect and a drain lag effect) associated with the electron traps, because a plurality of energy levels may be involved in the trapping effects of the GaN power amplifier. As shown in the example of FIG. 4B, different IIR filters may be configured to compensate for different memory effects of the GaN power amplifier respectively. For example, IIR filter 416 may be configured to compensate for gate lag effect in the GaN power amplifier, IIR filter 418 may be configured to compensate for drain lap effect in the GaN power amplifier, and IIR filter 420 may be configured to compensate for thermal effect in the GaN power amplifier.

Figure 5:
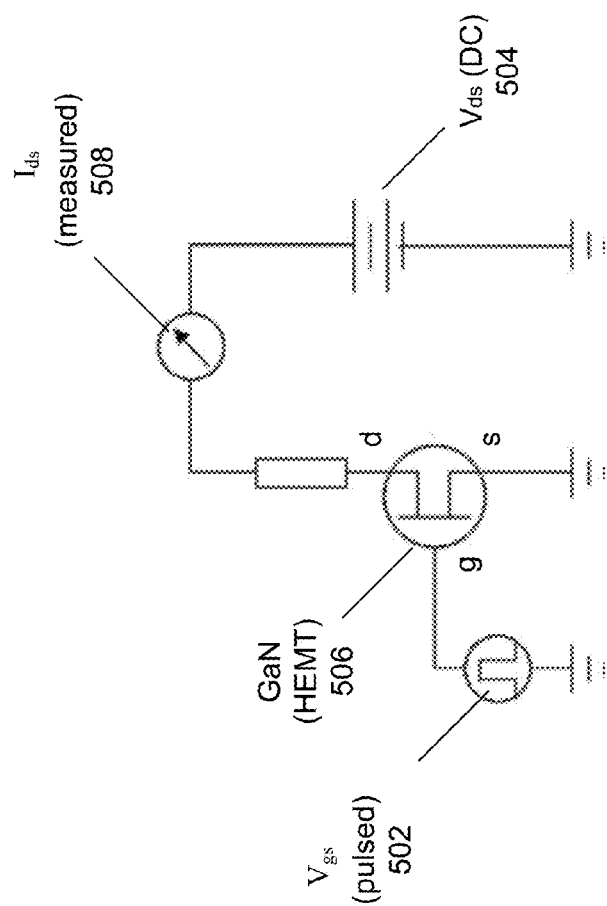
FIG. 5 is a block diagram illustrating a measurement system used for generating parameters for a DPD system according to some embodiments of the present disclosure.
Figure 6:
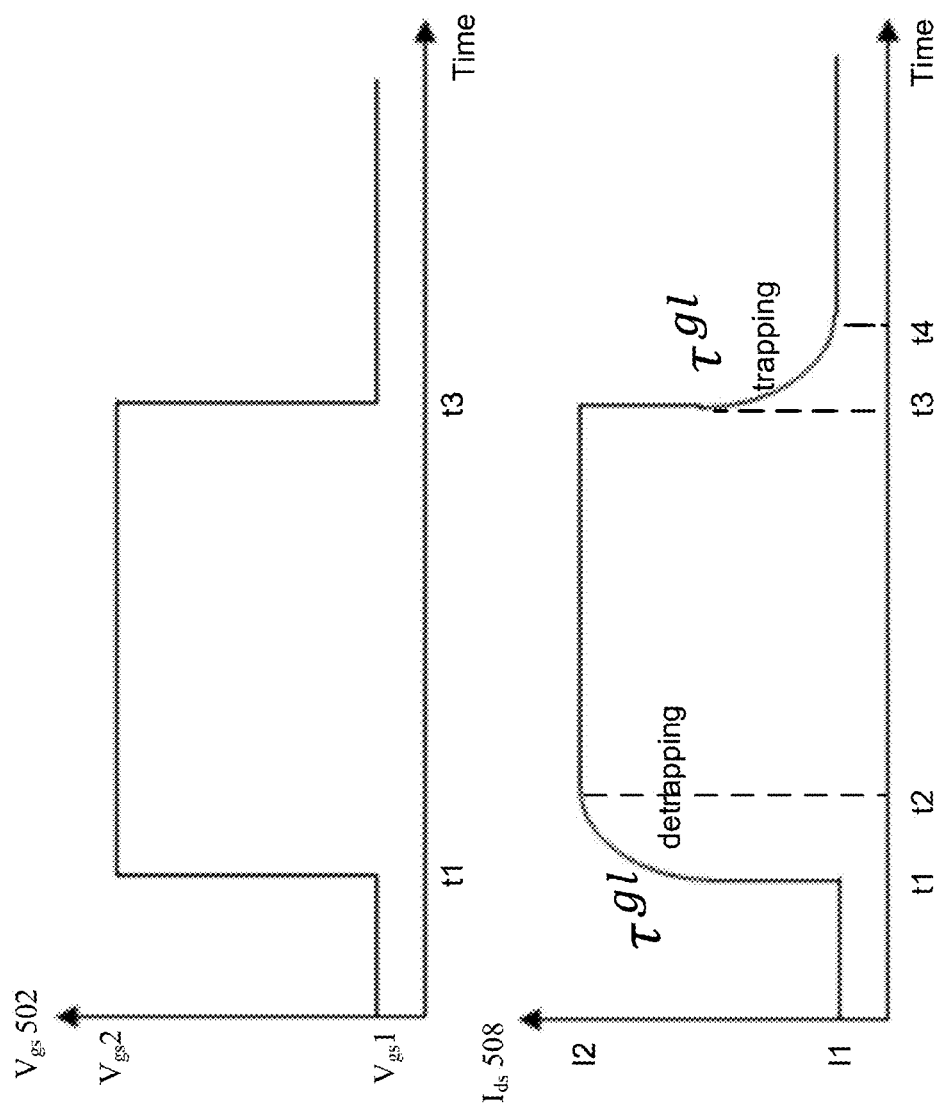
FIG. 6 illustrates measurement curves generated by the measurement system of FIG. 5 according to some embodiments of the present disclosure.

Referring to FIGS. 4B, 5 and 6, in some embodiments, parameters of the IIR filter 416 (e.g., parameters $\alpha_1$ and $\rho_1$) may be determined to compensate for the gate lag effect of the GaN power amplifier 304. The gate lag effect of the GaN power amplifier 304 may be characterized by a gate lag time constant $\tau^{gl}$ for given biased voltage conditions applied to a GaN transistor of the GaN power amplifier 304. Such biased voltage conditions may include gate to source bias voltage $V_{gs}$ and drain to source bias voltage $V_{ds}$. In an embodiment, parameter $\alpha_1$ of the IIR filter 416 of FIG. 4 may be calculated as follows:

$$\alpha_1 = \frac{1}{f_s * \tau^{gl}},$$

where $f_s$ is the digital data sampling frequency of signal 222, and $\tau^{gl}$ is a gate lag time constant.

In some embodiments, the gate lag time constant $\tau^{gl}$ may be measured by using a measurement system 500 of FIG. 5. A gate to source bias voltage $V_{gs}$ 502 and a drain to source bias voltage $V_{ds}$ 504 are applied to the GaN transistor 506 of the GaN power amplifier 304. The $V_{gs}$ 502 is a pulsed voltage, while $V_{ds}$ 504 is a constant voltage. A current $I_{ds}$ 508 is measured to determine the gate lag time constant $\tau^{gl}$. Referring to FIG. 6, gate lag time constant $\tau^{gl}$ may be determined when $V_{gs}$ 502 is switched between $V_{gs}1$ and $V_{gs}2$. For example, after $V_{gs}$ 502 is increased from voltage $V_{gs}1$ to voltage $V_{gs}2$ at time t1, because of a detrapping process in the GaN transistor 506, it takes a time period (also referred to as a transient period), for example, from time t1 to time t2, for $I_{ds}$ 508 to increase from value I1 to value I2. During a period from tim t2 to t3 (also referred to as a stable period), $I_{ds}$ remains at value I2 while $V_{gs}$ 502 remains at value $V_{gs}2$. For further example, after $V_{gs}$ 502 is decreased from $V_{gs}2$ to $V_{gs}1$ at time t3, because of a trapping process in the GaN transistor 506, it takes a time period (also referred to as a transient period), for example, from time t3 to time t4, for $I_{ds}$ 508 to decrease from value I2 to value I1. As such, gate lag time constant $\tau^{gl}$ may be determined using the measurements of $I_{ds}$ (e.g., I1, I2, t1, t2, t3, and t4).

Figure 7:
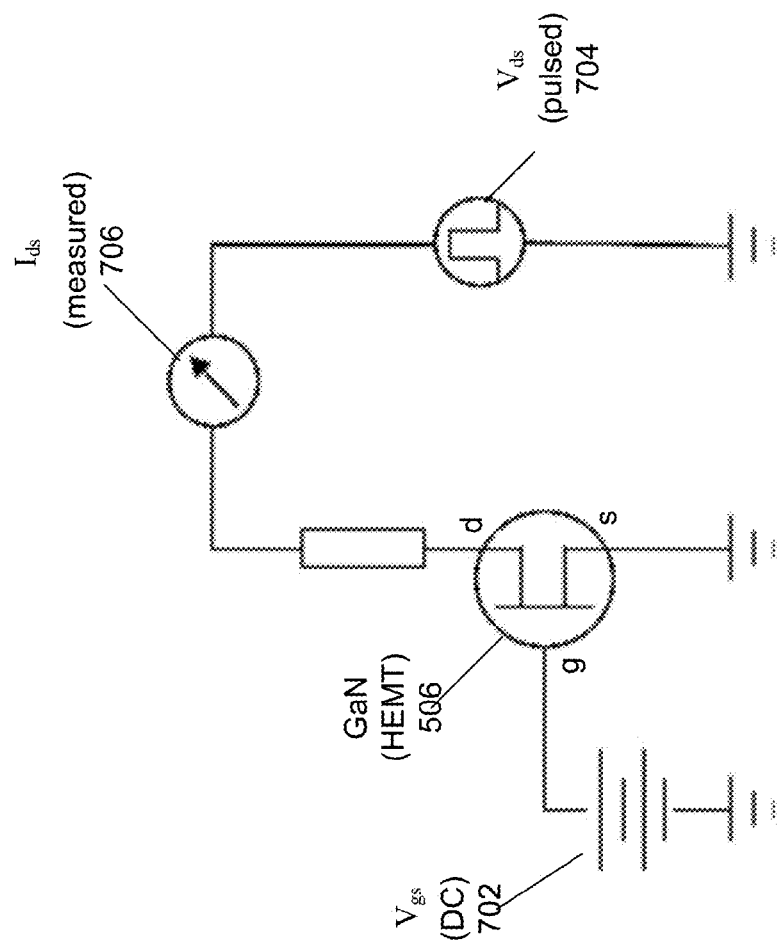
FIG. 7 is a block diagram illustrating a measurement system used for generating parameters for a DPD system according to some embodiments of the present disclosure.
Figure 8:
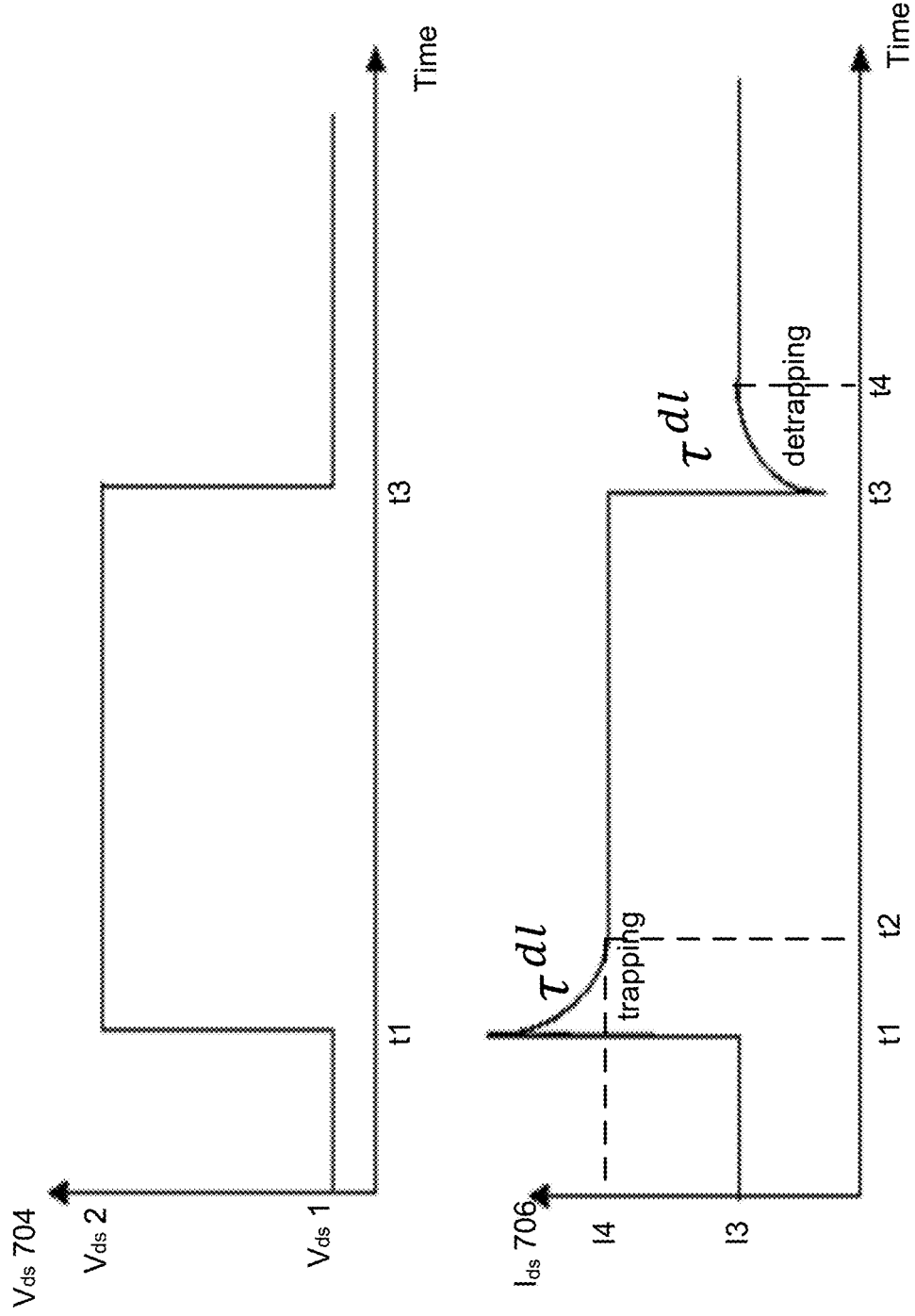
FIG. 8 illustrates measurement curves generated by the measurement system of FIG. 7 according to some embodiments of the present disclosure.

Referring to FIGS. 4B, 7 and 8, in some embodiments, parameters of the IIR filter 418 (e.g., parameters $\alpha_2$ and $\rho_2$) may be determined to compensate for the drain lag effect of GaN power amplifier 304. The drain lag effect of the GaN power amplifier 304 may be characterized by a drain lag time constant $\tau^{dl}$ for given biased voltage conditions applied to a GaN transistor of the GaN power amplifier 304. Such biased voltage conditions may include gate to source bias voltage $V_{gs}$ and drain to source bias voltage $V_{ds}$. In an embodiment, parameter $\alpha_2$ of the IIR filter 418 of FIG. 4B may be calculated as follows:

$$\alpha_2 = \frac{1}{f_s * \tau^{dl}},$$

where $f_s$ is the digital data sampling frequency, and $\tau^{dl}$ is a drain lag time constant.

In some embodiments, the drain lag time constant $\tau^{dl}$ may be measured using a measurement system 700 of FIG. 7. In measurement system 700, a gate to source bias voltage $V_{gs}$ 702 and a drain to source bias voltage $V_{ds}$ 704 are applied to the GaN transistor 506. The $V_{gs}$ 702 is a constant voltage, while $V_{ds}$ 704 is a pulsed voltage. A current $I_{ds}$ 706 is measured to determine the drain lag time constant $\tau^{dl}$. Referring to FIG. 8, drain lag time constant $\tau^{dl}$ may be determined when $V_{ds}$ 704 is switched between $V_{ds}1$ and $V_{ds}2$. For example, after $V_{ds}$ 704 is increased from voltage $V_{ds}1$ to voltage $V_{ds}2$ at time t1, because of a trapping process in the GaN transistor 506, it takes a time period (also referred to as a transient period), for example from time t1 to time t2, for $I_{ds}$ 706 to increase from value I3 to value I4. During a period from time t2 to time t3 (also referred to as a stable period), $I_{ds}$ 706 remains to have a value I4 while $V_{ds}$ 704 remains at value $V_{ds}2$. For further example, after $V_{ds}$ 704 is decreased from $V_{ds}2$ to $V_{ds}1$ at time t3, because of a detrapping process in the GaN transistor 506, it takes a time period (also referred to as a transient period), for example from time t3 to time t4, for $I_{ds}$ 706 to decrease from value I2 to value I1. As such, drain lag time constant $\tau^{dl}$ may be determined using the measurements of $I_{ds}$ (e.g., I3, I4, t1, t2, t3, and t4).

Referring to FIG. 4B, in some embodiments, an IIR filter 420 is configured to compensate for the thermal effect of a GaN power amplifier 304. Parameters $\alpha_3$ and $\rho_3$ may be adaptively configured by the amplification system 224 (e.g., using the adaptation block 308) to compensate for the thermal effect of the GaN power amplifier 304. In some embodiments, thermal effect of a GaN power amplifier may be characterized using a thermal time constant $\tau^{th}$, and parameters of the IIR filter 420 (e.g., parameters $\alpha_3$ and $\rho_3$) may be determined using the thermal time constant $\tau^{th}$. In an embodiment, parameter $\alpha_3$ of the IIR filter 420 of FIG. 4B may be calculated as follows:

$$\alpha_3 = \frac{1}{f_s * \tau^{th}},$$

where $f_s$ is the digital data sampling frequency, and $\tau^{th}$ is a thermal effect time constant.

In some embodiments, a thermal time constant $\tau^{th}$ is computed using a thermal resistance $C_{thermal}$ and a thermal capacitance $R_{thermal}$ of a GaN transistor used in the GaN power amplifier 304. In some examples, the thermal resistance $C_{thermal}$ and thermal capacitance $R_{thermal}$ may be determined based on materials (e.g., Si, SiC, sapphire) of the substrate of the GaN transistor.

Referring to FIGS. 4B, 9A, 9B, and 9C, in some embodiments, parameters of the IIR filters 416, 418, and 420 (e.g., parameters $\rho 1$, $\rho 2$, and $\rho 3$) may be determined such that output signals 436, 438, and 440 of the IIR filters 416, 418, and 420 approach zero when the output signals 436, 438, and 440 are stable. Referring to the examples of FIGS. 9A, 9B, and 9C, parameter $\rho 1$ of IIR filter 416 is determined based on the signal 444 in IIR filter 416 of FIG. 4B. Curve 902 of FIG. 9A illustrates the amplitude of signal 428 of FIG. 4B, curve 904 of FIG. 9B illustrates the amplitude of signal 444 of FIG. 4B, and curve 906 illustrates the magnitude of signal 436 of FIG. 4B. As shown in FIG. 9B, adapt window 908 extends between data sample index 910 and data sample index 912. The amplitude of signal 444 increases within adapt window 908 between data sample index 910 and data sample index 912, and becomes stable after data sample index 912. As such, parameter $\rho 1$ of the IIR filter 416 may be chosen to have the value of signal 444 at data sample index 912. As shown by curve 906, the output signal 436 of the IIR filter 416, generated by subtracting $\rho 1$ from signal 444, approaches zero after data sample index 912. Parameters $\rho 2$ and $\rho 3$ may be determined substantially similarly such that output signal 438 of IIR filter 418 and output signal 440 of IIR filter 420 approach zero after adapt windows of the respective IIR filters.

In some embodiments, $\rho 1$, $\rho 2$, and $\rho 3$ may have different values. Alternatively, in some embodiments, $\rho 1$, $\rho 2$, and $\rho 3$ may have the same value, which is the short time average of $|x(n)|$ for the data samples used to adapt main DPD path 402.

Figure 10:
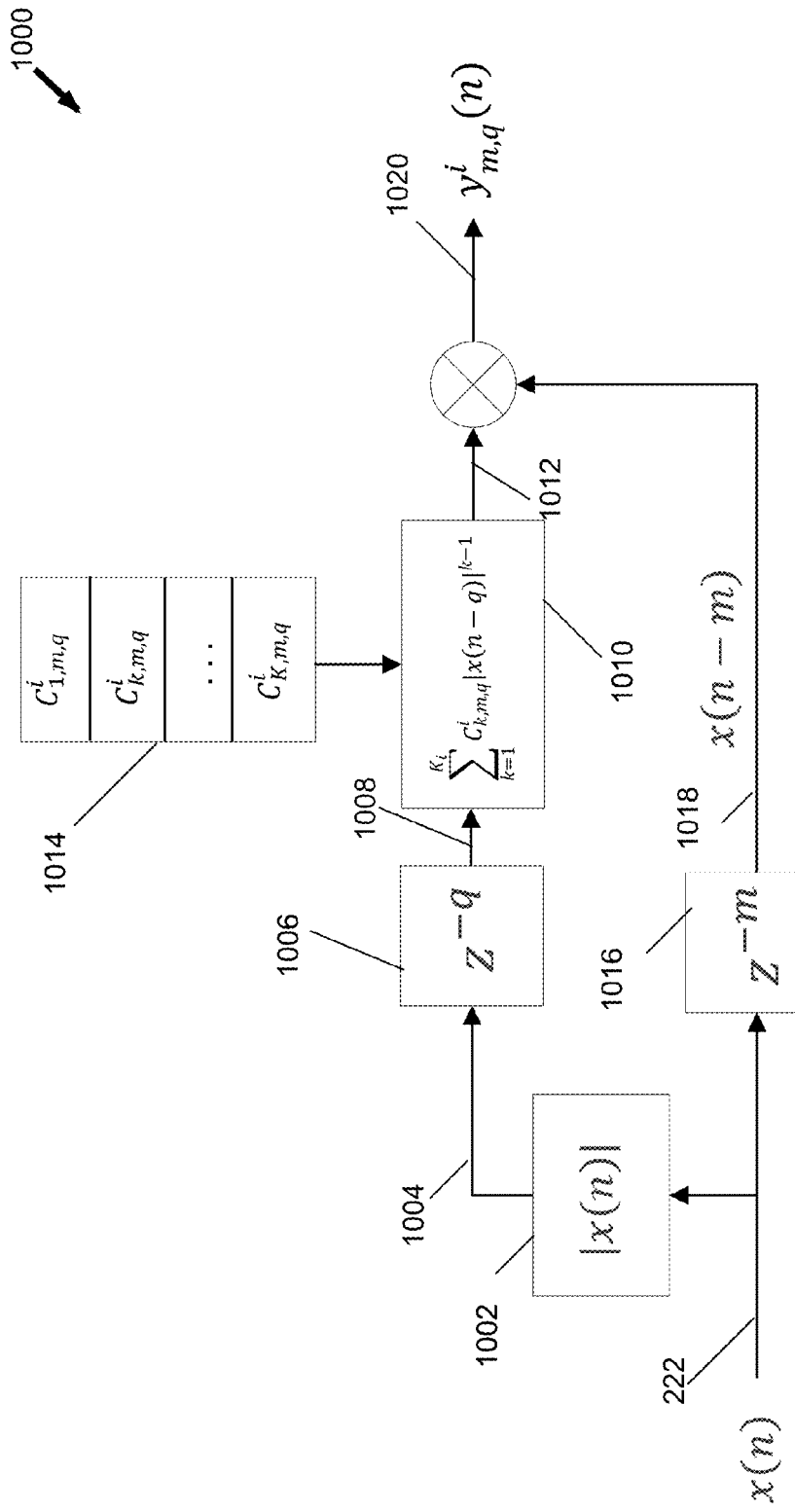
FIG. 10 is a block diagram illustrating a portion of a DPD system according to some embodiments of the present disclosure.

Referring to FIGS. 4B and 10, in various embodiments, each of DPD paths 402, 422, 424, and 426 may be a memoryless DPD path or a short term memory effect DPD path. In some examples, one or more of DPD paths 402, 422, 424, and 426 may be a memoryless DPD path implemented based on a memoryless PA model (e.g., polynomial model or Saleh's model). In some examples, one or more of DPD paths 402, 422, 424, and 426 may be a short term memory effect DPD path implemented based on a short term memory effect PA model, for example, memory polynomial model or Volterra model. In some embodiments, the adaptation block 308 updates the parameters of DPD paths 402, 422, 424, and 426 based on signals 222, 306, and 226 received by the adaptation block 308.

In some embodiments, each of the DPD paths 422, 424, 426, and 402 of FIG. 4B is a Volterra polynomials based non-linear function data path. The DPD path 402 may be implemented with general memory polynomials having parameters $K_0$, $M_0$, and $Q_0$, where $K_0$ is referred to as the non-linear order of the DPD path 402, and $M_0$ and $Q_0$ are referred to as memory taps of the DPD path 402. The output $y^0(n)$ of the DPD path 402 may be expressed as follows:

$$y^0(n)=\Sigma_{k,m,q}C_{k,m,q}^0 x(n-m)|x(n-q)|^{k-1}=\Sigma_{m,q}y_{m,q}^0(n),$$

where k, m, and q are integers, and $k=1:K_0$, $m=1:M_0$, and $q=1:Q_0$. For each pair of m and q, $y_{m,q}^0(n)$ may be expressed as follows:

$$y_{m,q}^0(n)=\Sigma_{k=1}^{K_0}C_{k,m,q}^0 x(n-m)|x(n-q)|^{k-1}=x(n-m)\Sigma_{k=1}^{K_0}C_{k,m,q}^0|x(n-q)|^{k-1}.$$

The DPD path 422 may be implemented with general memory polynomials having parameters $K_1$, $M_1$, and $Q_1$, where $K_1$ is referred to as the non-linear order of the DPD path 422, and $M_1$ and $Q_1$ are referred to as memory taps of the DPD path 422. The output $y^1(n)$ of the DPD path 422 may be expressed as follows:

$$y^1(n)=\Sigma_{k,m,q}C_{k,m,q}^1 x(n-m)|x(n-q)|^{k-1}=\Sigma_{m,q}y_{m,q}^1(n),$$

where k, m, and q are integers, and $k=m=1:K_1$, $m=1:M_1$, and $q=1:Q_1$. For each pair of m and q, $y_{m,q}^1(n)$ may be expressed as follows:

$$y_{m,q}^1(n)=\Sigma_{k=1}^{K_1}C_{k,m,q}^1 x(n-m)|x(n-q)|^{k-1}=x(n-m)\Sigma_{k=1}^{K_1}C_{k,m,q}^1|x(n-q)|^{k-1}.$$

The DPD path 424 may be implemented with general memory polynomials having parameters $K_2$, $M_2$, and $Q_2$, where $K_2$ is referred to as the non-linear order of the DPD path 424, and $M_2$ and $Q_2$ are referred to as memory taps of the DPD path 424. The output $y^2(n)$ of the DPD path 424 may be expressed as follows:

$$y_{m,q}^2(n)=\Sigma_{k=1}^{K_2}C_{k,m,q}^2 x(n-m)|x(n-q)|^{k-1}=x(n-m)\Sigma_{k=1}^{K_2}C_{k,m,q}^2|x(n-q)|^{k-1}.$$

where k, m, and q are integers, and k=1:$K_2$, m=1:$M_2$, and q=1:$Q_2$. For each pair of m and q, $y_{m,q}^2(n)$ may be computed as follows:

$$y_{m,q}^3(n) = \sum_{k=1}^{K_3} C_{k,m,q}^3 x(n-m)|x(n-q)|^{k-1} = x(n-m) \sum_{k=1}^{K_3} C_{k,m,q}^3 |x(n-q)|^{k-1}.$$

In some examples, the DPD path 426 is implemented with general memory polynomials having parameters $K_3$, $M_3$, and $Q_3$, where $K_3$ is referred to as the non-linear order of the DPD path 426, and $M_3$ and $Q_3$ are referred to as memory taps of the DPD path 426. The output $y^3(n)$ of the DPD path 426 may be expressed as follows:

$$y^3(n) = \sum_{m,q} C_{k,m,q}^3 x(n-m)|x(n-q)|^{k-1} = \sum_{m,q} y_{m,q}^3(n),$$

where k, m, and q are integers, and k=1:$K_3$, m=1:$M_3$, and q=1:$Q_3$. For each pair of m and q, $y_{m,q}^3(n)$ may be expressed as follows:

$$y_{m,q}^3(n) = \sum_{k=1}^{K_3} C_{k,m,q}^3 x(n-m)|x(n-q)|^{k-1} = x(n-m) \sum_{k=1}^{K_3} C_{k,m,q}^3 |x(n-q)|^{k-1}.$$

Referring to the example of FIG. 10, $y_{m,q}^i(n)$ (e.g., $y_{m,q}^0(n)$ of DPD path 402, $y_{m,q}^1(n)$ of DPD path 422, $y_{m,q}^2(n)$ of DPD path 424, $y_{m,q}^3(n)$ of DPD path 426) may be computed using a subpath unit 1000 using a lookup table (LUT) storing coefficients $C_{k,m,q}^i$. As illustrated in FIG. 10, in a subpath unit 1000, signal 222 x(n) is sent to block 1002 to generate signal 1004 having an absolute value of x(n). Signal 1004 is then sent to a delay unit 1006 to generate signal 1008 |x(n−q)|. Signal 1008 is then sent to block 1010, which outputs signal 1012 having a value of $\sum_{k=1}^{K_i} C_{k,m,q}^i |x(n-q)|^{k-1}$ using an LUT 1014 storing coefficients $C_{k,m,q}^i$. Signal 222 is also sent to a delay unit 1016 to generate signal 1018 x(n−m). Signals 1012 and 1018 are sent to a multiplier to generate signal 1020 $y_{m,q}^i$. As discussed above, (n) of all m and q pairs may then be combined to generate $y_{m,q}^i(n)$ (e.g., $y_{m,q}^i(n)$ of DPD path 402, $y^1(n)$ of DPD path 422, $y^2(n)$ of DPD path 424, $y^3(n)$ of DPD path 426).

In some embodiments, DPD paths 402, 422, 424, and 426 have different DPD models with different parameters. In some examples, each of $K_1$, $K_2$, and $K_3$ of DPD paths 422, 424, and 426 is less than or equal to $K_0$ of DPD path 402. In some examples, each of $M_1$, $M_2$, and $M_3$ of DPD paths 422, 424, and 426 is less than or equal to $M_0$ of DPD path 402. In some examples, each of $Q_1$, $Q_2$, and $Q_3$ of DPD paths 422, 424, and 426 is less than or equal to $Q_0$ of DPD path 402. In some examples, the associated coefficients $C_{k,m,q}^0$, $C_{k,m,q}^1$, $C_{k,m,q}^2$, $C_{k,m,q}^3$ and the respective lookup tables storing those coefficients for computing $y_{m,q}^0$ of DPD path 402, $y_{m,q}^1$ of DPD path 422, $y_{m,q}^2$ of DPD path 424, and $y_{m,q}^3$ of DPD path 426 are different.

In some embodiments, the feedback data (e.g., signal 444) collected during the adapt windows (e.g., adapt window 908 of IIR filter 416 as shown in FIG. 9B) are used to adapt the DPD paths 422, 424, and 426 (e.g., $K_0$, $K_1$, $K_2$, $K_3$, $M_0$, $M_1$, $M_2$, $M_3$, $Q_0$, $Q_1$, $Q_2$, $Q_3$, $C_{k,m,q}^0$, $C_{k,m,q}^1$, $C_{k,m,q}^2$, $C_{k,m,q}^3$) by the adaptation block 308 of FIG. 3.

Referring to FIGS. 3, 4B, 11A, 11B, 11C, and 11D, in some embodiments, adaptation block 308 of FIG. 3 determines the parameters of DPD system 302B using an adaptation process. The adaptation process includes sequential adaptation steps, where each adaptation step adapts parameters of one of the DPD paths 402, 404, 406, and 408 of the DPD system 302B. The parameters of DPD system 302B to be adapted may include IIR filter parameters (e.g., parameters $\alpha_1$, $\alpha_2$, $\alpha_3$, $\rho_1$, $\rho_2$, $\rho_3$) of the IIR filters 416, 418, and 420 of DPD paths 404, 406, and 408 and parameters (e.g., $K_0$, $K_1$, $K_2$, $K_3$, $M_0$, $M_1$, $M_2$, $M_3$, $Q_0$, $Q_1$, $Q_2$, $Q_3$, $C_{k,m,q}^0$, $C_{k,m,q}^1$, $C_{k,m,q}^2$, $C_{k,m,q}^3$) of the DPD paths 402, 422, 424, and 426.

Figure 11A:
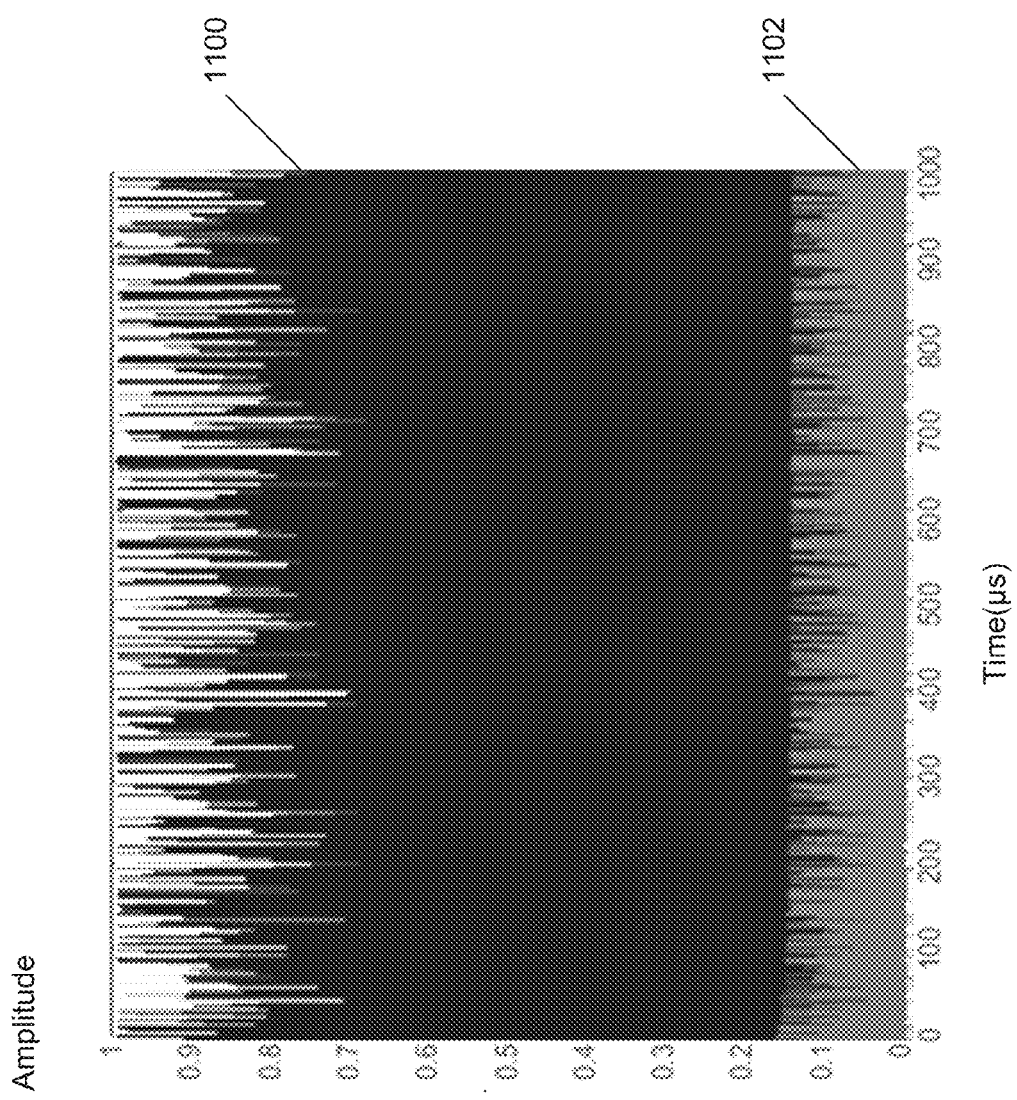

Referring to FIGS. 3, 4B, and 11A, at a first adaptation step of the adaptation process for adapting parameters of DPD path 402, none of the DPD paths 402, 404, 406, and 408 have been adapted. As illustrated in FIG. 11A, adaptation block 308 determines a first error 1102 between signal x(n) and y'(n). In the example of FIG. 11A, a maximum amplitude of the first error 1102 is about 15% of the maximum amplitude of the input signal x(n) as shown in curve 1100. The adaptation block 308 may then use the first error 1102 to adapt parameters (e.g., $K_0$, $M_0$, $Q_0$, $C_{k,m,q}^0$) of DPD path 402 of FIG. 4B.

Figure 11B:
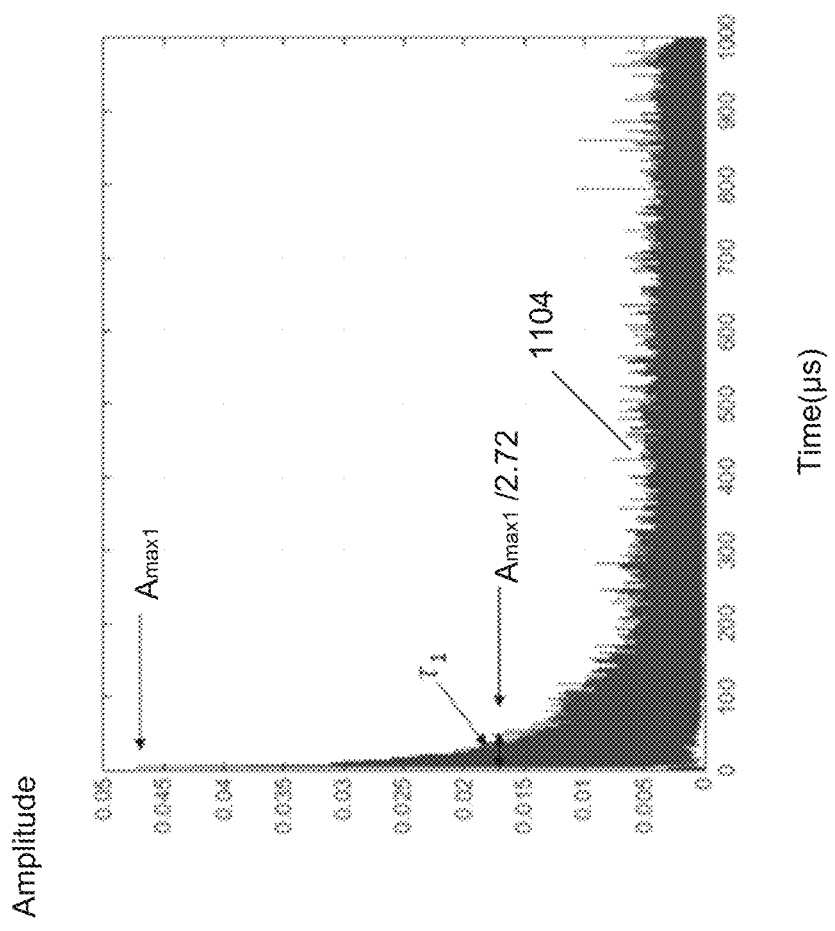

Referring to FIGS. 3, 4B, and 11B, after adapting DPD path 402 using the first error 1102 during the first adaptation step, the adaptation process proceeds to the second adaptation step to adapt parameters of DPD path 404. At this stage, only DPD path 402 of DPD paths 402, 404, 406, and 408 have been adapted. As illustrated in FIG. 11B, adaptation block 308 determines a second error 1104 between signal x(n) and y'(n). In the example of FIG. 11B, a maximum amplitude $A_{max1}$ of the second error 1104 is about 4.7% of the maximum amplitude of the input signal x(n). The adaptation block 308 may then use the second error 1104 to adapt parameters (e.g., $K_1$, $M_1$, $Q_1$, $C_{k,m,q}^1$) of DPD path 422 of DPD path 404, and adapt IIR parameters (e.g., $\alpha_1$) of IIR filter 416 of DPD path 404. In an example, parameter $\alpha_1$ of IIR filter 416 may be determined as:

$$\alpha_1 = \frac{1}{f_s * \tau_1},$$

where $f_s$ is the digital data sampling frequency, and is the time interval for the amplitude of the second error 1104 to drop from a maximum error amplitude $A_{max1}$ (e.g., of about 0.047) to a particular portion of the maximum error amplitude (e.g., of about 0.017 or about $A_{max1}/2.72$).

Referring to FIGS. 3, 4B, 11C, and 11D, after adapting DPD path 404 using the second error 1104 during the second adaptation step, the adaptation process proceeds to the third adaptation step to adapt parameters of DPD path 406. At this stage, only DPD paths 402 and 404 of DPD paths 402, 404, 406, and 408 have been adapted. As illustrated in FIGS. 11C and 11D, adaptation block 308 determines a third error 1106 between signal x(n) and y'(n). As shown in FIG. 11D, which illustrates an enlarged graph of area 1108 of FIG. 12C, a maximum amplitude $A_{max2}$ of the third error 1106 is about 1.5% of the maximum amplitude of the input signal x(n). The adaptation block 308 may then use the third error 1106 to adapt parameters (e.g., $K_2$, $M_2$, $Q_2$, $C_{k,m,q}^2$) of DPD path 424 of DPD path 406, and adapt IIR parameters (e.g., $\alpha_2$) of IIR filter 418 of DPD path 406. In an example, parameter $\alpha_2$ of IIR filter 418 may be determined as:

$$\alpha_2 = \frac{1}{f_s * \tau_2},$$

where $f_s$ is the digital data sampling frequency, and where $\tau_2$ is the time interval for the amplitude of the second error 1104 to drop from a maximum error amplitude $A_{max2}$ (e.g., of about 0.015) to a particular portion of the maximum error amplitude (e.g., of about 0.05 or about $A_{max2}/2.72$).

Similarly, after adapting DPD paths 402, 404, and 406, the adaptation process proceeds may proceed to the next adaptation step to adapt parameters of DPD path 408. Parameters (e.g., $K_3$, $M_3$, $Q_3$, $C_{k,m,q}^3$) of DPD path 426 of DPD path 408, and IIR parameters (e.g., $\alpha_3$) of IIR filter 420 of DPD path 408 may be determined by adaptation block 308 substantially similar to parameters of DPD paths 404 and 406 as discussed about with reference to FIGS. 3, 4B, and 11A-11D.

Figure 12B:
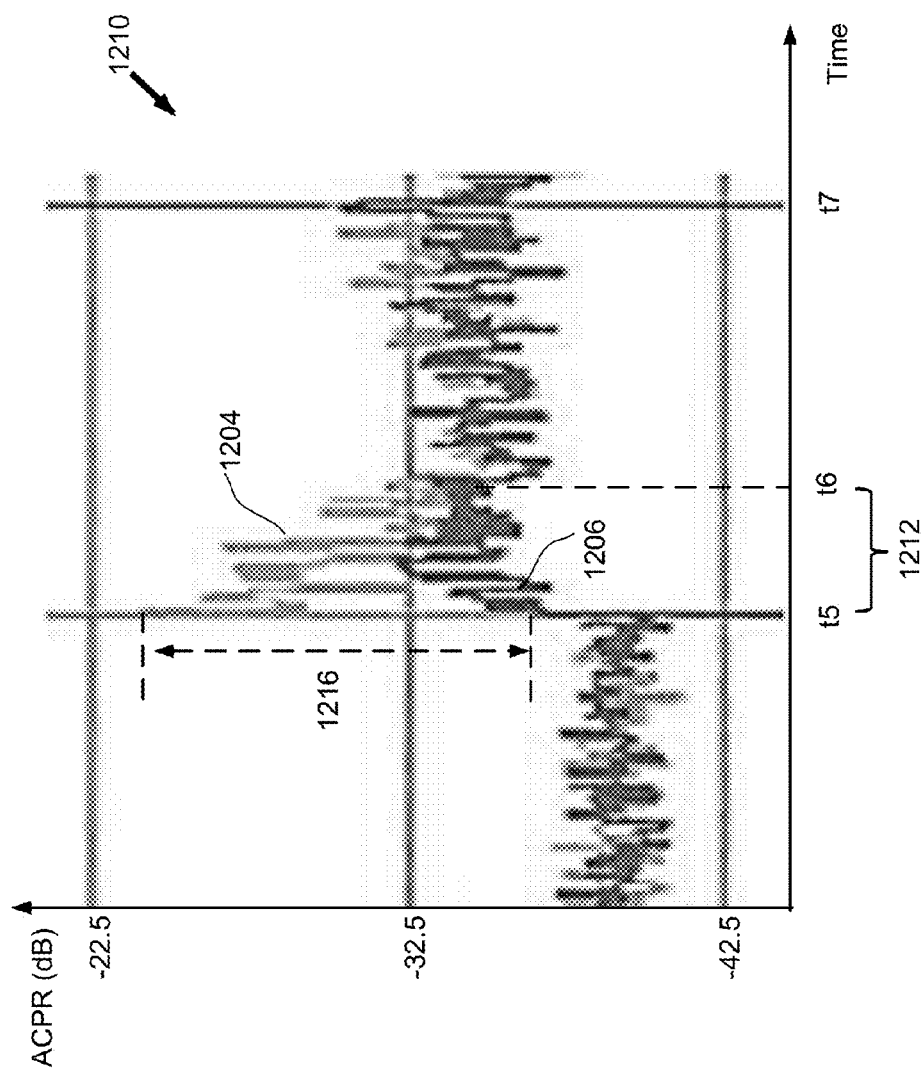

Referring to FIGS. 12A and 12B, by using DPD systems to compensate for distortion of the power amplifier in a communication system, performance of a communication system may be improved. Illustrated in FIGS. 12A and 12B are graphs showing ACPR as a function of time for an output of a GaN power amplifier used in communication systems with different DPD configurations. FIG. 12B illustrates an enlarged graph of area 1210 of FIG. 12A. Curve 1202 corresponds to a communication system 200 with a power amplification unit 224 that does not include any DPD system. Curve 1204 corresponds to a communication system 200 where its power amplification unit 224 includes a DPD system 302A of FIG. 4A, which includes a memory polynomial model based DPD. Curve 1206 corresponds to a communication system 200 where its power amplification unit 224 includes a DPD system 302B of FIG. 4B, which includes parallel DPD paths with IIR filters configured to compensate for long term memory effects in the GaN amplifier. The GaN power amplifier is turned off for receive time slots (e.g., a period from time t3 to time t5, a period from time t9 to time t11), and is turned on during transmit time slots (e.g., a period from time t0 to time t3, and a period from time t5 to time t9) for transmit time slots. As shown by curve 1202, in a communication system without a DPD system, the ACPR of the transmit time slots is about 30 dB greater than the ACPR of the receive time slots, which may be caused by the distortion of the GaN power amplifier.

As shown by curve 1204, by deploying DPD system 302A of FIG. 4A, the ACPR of the transmit time slots is reduced by an ACPR difference 1208 (e.g., more than about 20 dB) from the ACPR of curve 1202 during receive time slots. However, curve 1204 also shows performance degradation during transient periods 1212 (e.g., a period from time t5 to time t6), which may be attributed to deep electron traps effects of the GaN power amplifier.

As shown by curve 1206, by deploying DPD system 302B of FIG. 4B to compensate for long term memory effects of the GaN power amplifier, the performance degradation shown in curve 1204 during the transient periods 1212 is reduced or eliminated. For example, at time t5 right after the GaN power amplifier is turned on, the ACPR of curve 1206 is improved by an ACPR difference 1216 (e.g., between about 10 dB 15 dB) comparing to the APCR of curve 1204. On the other hand, during stable periods 1214 (e.g., from time t6 to time t9) of the GaN power amplifier, the ACPR performances shown in curves 1204 and 1206 have substantially similar values.

Figure 13:
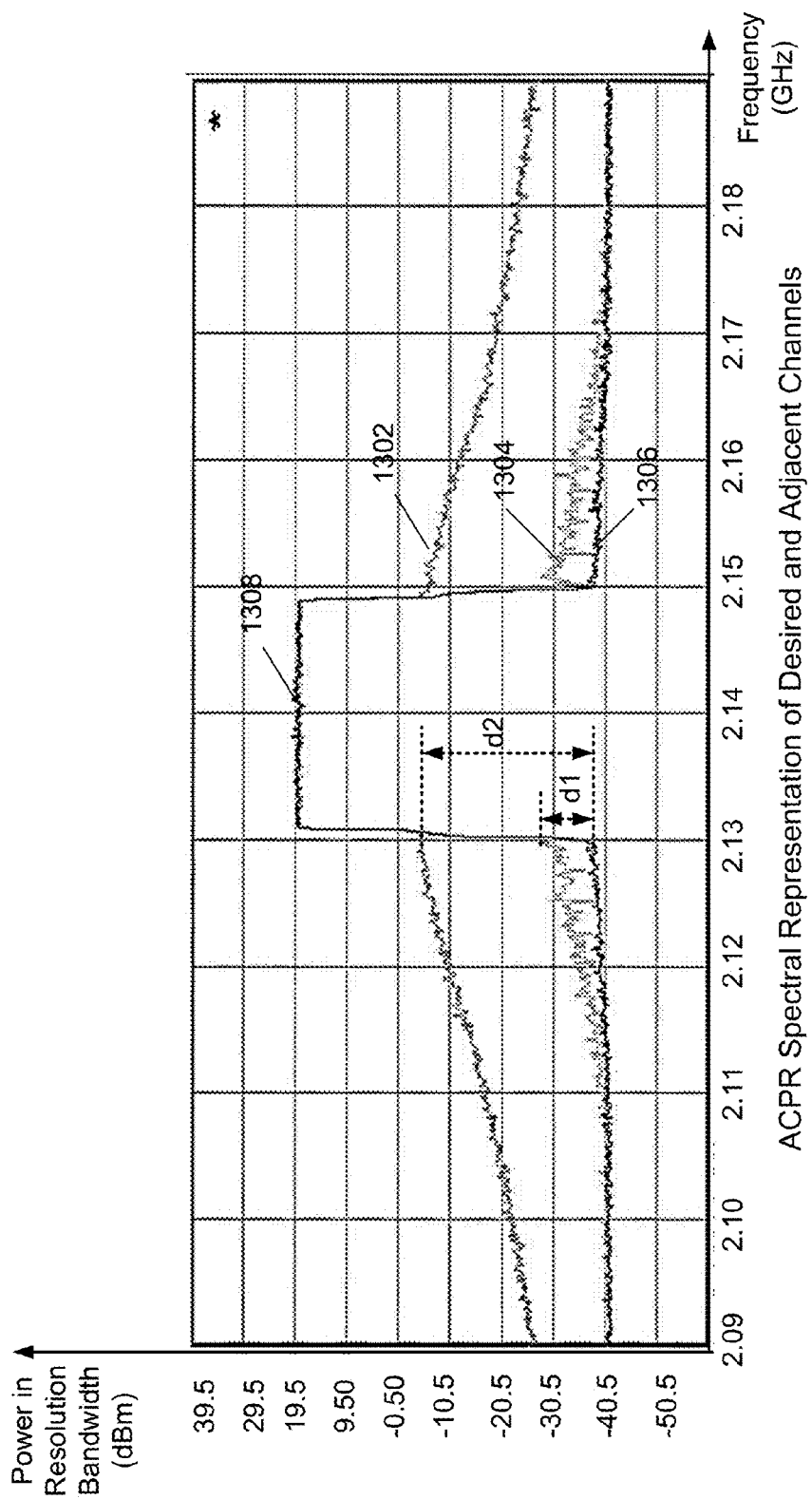
FIG. 13 illustrates comparisons of ACPR spectrum sweep performances of various embodiments according to the present disclosure.

Referring to the example of FIG. 13, illustrated are power spectrums of an output of a GaN power amplifier used in communication systems with different DPD configurations. The power spectrums are generated using a spectrum analyzer using a resolution bandwidth of 100 kHz and a video bandwidth of 100 kHz. The main channel (desired channel) power 1308 is located around a channel center frequency of 2.14 GHz. ACPR may be computed as the ratio of the power in an adjacent channel at a particular frequency offset from the center frequency to the main channel power 1308. In the example of FIG. 10, curve 1302 corresponds to spectrums for an output of a GaN power amplifier in a TDD-LTE communication system without any DPD system. Curve 1304 corresponds to spectrums for an output signal of the power amplifier of a TDD-LTE communication system using a DPD system 302A of FIG. 4A. Curve 1306 corresponds to spectrum for an output signal of the power amplifier of a TDD-LTE communication system using a DPD system 302B of FIG. 4B. As shown in FIG. 13, at an offset of 10 MHz from the center frequency of 2.14 MHz, by using the DPD system of FIG. 4B to compensate for long term memory effects of the GaN power amplifier, the ACPR is improved by a value d1 (e.g., between about 10 dB and 15 dB) comparing to the communication system using a DPD system 302A of FIG. 4A. Similarly, at an offset of 10 MHz from the center frequency of 2.14 MHz, by using the DPD system 302B of FIG. 4B, the ACPR is improved by a value d2 (e.g., about 35 dB) comparing to the communication system without any DPD system.

It is noted that various configurations (e.g., number of DPD paths in the DPD system, orders and coefficients of the IIR filters) illustrated in FIGS. 2-13 are exemplary only and not intended to be limiting beyond what is specifically recited in the claims that follow. It will be understood by those skilled in the art that other configurations may be used. While an exemplary LTE-TDD communication system is illustrated, the DPD system may be used to in any communication systems (e.g., FDD-LTE, wideband code division multiple access (WCDMA)/High Speed Packet Access(HSPA), and orthogonal frequency division multiplexing (OFDM) systems), where the communication systems deploy a GaN power amplifier and have dynamic transmit powers.

Various advantages may be present in various applications of the present disclosure. No particular advantage is required for all embodiments, and different embodiments may offer different advantages. One of the advantages of some embodiments is that by using IIR filters to model long term memory effects of a GaN power amplifier, performance (e.g., ACPR performance) of a communication system using the GaN power amplifier may be improved significantly. Another advantage of some embodiments is that a plurality of parallel IIR filters may be used to compensate for different long term memory effects of the GaN power amplifier, which may improve computation efficiency of the digital predistortion process.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A digital predistortion (DPD) system, comprising:
   an input configured to receive a DPD input signal associated with a first sampling frequency;
   a first predistortion circuit configured to provide a first signal path coupled to the input to generate a first predistortion signal, the first predistortion circuit including a first infinite impulse response (IIR) filter;
   a second predistortion circuit configured to provide a second signal path coupled to the input in parallel with the first signal path to generate a second predistortion signal, the second predistortion circuit including a second IIR filter; and a combiner circuit configured to combine the first predistortion signal and the second predistortion signal to generate a DPD output signal, wherein the DPD output signal is coupled to an input of a power amplifier having a plurality of memory effects, wherein a first parameter of the first IIR filter is determined based on the first sampling frequency and a first memory effect time constant associated with a first memory effect.

2. The DPD system of claim 1, wherein the DPD output signal is configured to compensate for the plurality of memory effects of the power amplifier.

3. The DPD system of claim 2, wherein the power amplifier includes a gallium nitride (GaN) transistor.

4. The DPD system of claim 3, wherein the first memory effect time constant is determined by measuring a drain to source current of the GaN transistor.

5. The DPD system of claim 3, wherein the second IIR filter is configured to compensate for a second memory effect of the GaN transistor, and wherein the second memory effect is different from the first memory effect.

6. The DPD system of claim 5, wherein each of the first and second memory effects is selected from the group consisting of a gate lag effect, a drain lag effect, and a thermal effect of the GaN transistor.

7. The DPD system of claim 1, wherein the first IIR filter and the second IIR filter are of different orders.

8. The DPD system of claim 1, further comprising:

a third predistortion circuit configured to provide a third signal path coupled to the input in parallel with the first and second signal paths to generate a third predistortion signal, wherein the third predistortion circuit does not include an IIR filter, and wherein the combiner circuit is configured to combine the first, second, and third predistortion signals to generate the DPD output signal.

9. The DPD system of claim 8, wherein the third predistortion circuit is configured to perform a memory polynomial based predistortion operation on the DPD input signal to generate the third predistortion signal.

10. The DPD system of claim 1, wherein the first predistortion circuit includes one of a memoryless DPD path and a short term memory effect DPD path parallel to the first IIR filter.

11. A method, comprising:

receiving a DPD input signal associated with a first sampling frequency at an input of a digital predistortion (DPD) system;

providing, by a first predistortion circuit of the DPD system, a first signal path coupled to the input to generate a first predistortion signal, wherein the first predistortion circuit includes a first infinite impulse response (IIR) filter, wherein a first parameter of the first IIR filter is determined based on the first sampling frequency and a first memory effect time constant associated with a first memory effect of a power amplifier;

providing, by a second predistortion circuit of the DPD system, a second signal path coupled to the input in parallel with the first signal path to generate a second predistortion signal, wherein the second predistortion circuit includes a second IIR filter;

combining the first predistortion signal and the second predistortion signal to generate a DPD output signal; and providing the DPD output signal to an input of the power amplifier.

12. The method of claim 11, comprising:

amplifying, by the power amplifier, the DPD output signal to generate an amplified output signal;

wherein the DPD system is configured to compensate for a plurality of memory effects of the power amplifier.

13. The method of claim 12, wherein the power amplifier includes a gallium nitride (GaN) transistor.

14. The method of claim 13, comprising:

compensating for a second memory effect of the GaN transistor using the second IIR filter;

wherein the second memory effect is different from the first memory effect.

15. The method of claim 14, wherein each of the first and second memory effects is selected from the group consisting of a gate lag effect, a drain lag effect, and a thermal effect of the GaN transistor.

16. The method of claim 11, wherein the first IIR filter and the second IIR filter are of different orders.

17. The method of claim 11, further comprising:

providing, by a third predistortion circuit of the DPD system, a third signal path coupled to the input in parallel with the first and second signal paths to generate a third predistortion signal, wherein the third predistortion circuit does not include an IIR filter; and combining the first, second, and third predistortion signals to generate the DPD output signal.

18. The method of claim 17, further comprising:

performing, by the third predistortion circuit, a memory polynomial based predistortion operation on the DPD input signal to generate the third predistortion signal.

19. The method of claim 11, wherein the first predistortion circuit includes one of a memoryless DPD path and a short term memory effect DPD path parallel to the first IIR filter.

20. The method of claim 11, wherein a second parameter of the first IIR filter is determined based on a first adapt window of the first IIR filter such an output signal of the first IIR filter approach zero after the first adapt window.

* * * * *